US006585825B1

(12) United States Patent
Skee

(10) Patent No.: US 6,585,825 B1
(45) Date of Patent: *Jul. 1, 2003

(54) STABILIZED ALKALINE COMPOSITIONS FOR CLEANING MICROELECTRONIC SUBSTRATES

(75) Inventor: David C. Skee, Bethlehem, PA (US)

(73) Assignee: Mallinckrodt Inc, St. Louis, MO (US)

(*) Notice: Subject to any disclaimer, the term of this patent is extended or adjusted under 35 U.S.C. 154(b) by 167 days.

This patent is subject to a terminal disclaimer.

(21) Appl. No.: 09/688,559

(22) Filed: Oct. 16, 2000

Related U.S. Application Data

(63) Continuation-in-part of application No. PCT/US99/10875, filed on May 17, 1999.
(60) Provisional application No. 60/115,084, filed on Jan. 7, 1999, and provisional application No. 60/085,861, filed on May 18, 1998.

(51) Int. Cl.[7] .................................................. C23G 1/02
(52) U.S. Cl. ................ 134/3; 134/2; 134/10; 134/34; 252/79.1; 252/79.5; 252/102; 252/156
(58) Field of Search ............................ 134/2, 3, 10, 34, 134/42; 252/79.5, 156, 102, 173, 79.1

(56) References Cited

U.S. PATENT DOCUMENTS

| | | | | |
|---|---|---|---|---|
| 5,290,361 A | * | 3/1994 | Hayashida .................... 134/2 |
| 5,466,389 A | * | 11/1995 | Ilardi et al. .................. 252/156 |
| 5,753,601 A | | 5/1998 | Ward et al. .................. 510/176 |
| 5,795,702 A | | 8/1998 | Tanabe et al. ............... 430/331 |
| 6,020,292 A | | 2/2000 | Honda ......................... 510/175 |
| 6,117,783 A | * | 9/2000 | Small et al. ................. 438/693 |

FOREIGN PATENT DOCUMENTS

| | | | |
|---|---|---|---|
| EP | 596515 A1 | 5/1994 | ............ G03F/7/42 |
| EP | 678571 A2 | 10/1995 | ............ C11D/3/30 |
| EP | 690483 A2 | 1/1996 | ........ H01L/21/306 |
| WO | WO 99/60448 A1 | 11/1999 | |
| WO | WO 00/11091 | 3/2000 | ............ C09D/9/00 |

* cited by examiner

Primary Examiner—Randy Gulakowski
Assistant Examiner—Gentle E. Winter

(57) ABSTRACT

The invention provides aqueous alkaline compositions useful in the microelectronics industry for stripping or cleaning semiconductor wafer substrates by removing photoresist residues and other unwanted contaminants. The compositions typically contain (a) one or more metal ion-free bases at sufficient amounts to produce a pH of about 11–13 and one or more bath stabilizing agents to maintain this pH during use; (b) optionally, about 0.01% to about 5% by weight (expressed as % $SiO_2$) of a water-soluble metal ion-free silicate; (c) optionally, about 0.01% to about 10% by weight of one or more chelating agents; (d) optionally, about 0.01% to about 80% by weight of one or more water-soljuble organic co-solvents; and (e) optionally, about 0.01% to about 1% by weight of a water-soluble surfactant.

54 Claims, No Drawings

STABILIZED ALKALINE COMPOSITIONS FOR CLEANING MICROELECTRONIC SUBSTRATES

CROSS REFERENCE TO RELATED APPLICATIONS

This application is a continuation-in-part of Serial No. PCT/US99/10875, which has an international filing date of May 7, 1999 and which designates the United States, which is related to U.S. provisional applications Serial No. 60/115,084, filed Jan. 7, 1999, and Ser. No. 60/085,861, filed May 18, 1998. All of these applications are incorporated herein by referencte in their entirety.

BACKGROUND OF THE INVENTION

1. Field of the Invention

This invention relates to compositions useful in the microelectronics industry for cleaning semiconductor wafer substrates. Particularly, this invention relates to alkaline stripping or cleaning compositions containing bath stabilizing agents that are used for cleaning wafers having metal lines and vias by removing metallic and organic contamination without damaging the integrated circuits.

2. Description of the Prior Art

An integral part of microelectronic fabrication is the use of photoresists to transfer an image from a mask or reticle to the desired circuit layer. After the desired image transfer has been achieved, an etching process is used to form the desired structures. The most common structures formed in this way are metal lines and vias.

The metal lines are used to form electrical connections between various parts of the integrated circuit that lie in the same fabrication layer. The vias are holes that are etched through dielectric layers and later filled with a conductive metal. These are used to make electrical connections between different vertical layers of the integrated circuit. A halogen containing gas is generally used in the processes used for forming metal lines and vias.

After the etching process has been completed, the bulk of the photoresist may be removed by either a chemical stripper solution or by an oxygen plasma ashing process. The problem is that these etching processes produce highly insoluble metal-containing residues that may not be removed by common chemical stripper solutions. Also, during an ashing process the metal-containing residues are oxidized and made even more difficult to remove, particularly in the case of aluminum-based integrated circuits. See, "Managing Etch and Implant Residue," *Semiconductor International*, August 1997, pages 56–63.

An example of such an etching process is the patterning of metal lines on an integrated circuit. In this process, a photoresist coating is applied over a metal film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual metal etching step is then performed. This etching step removes metal not covered by photoresist through the action of a gaseous plasma. Removal of such metal transfers the pattern from the photoresist layer to the metal layer. The remaining photoresist is then removed ("stripped") with an organic stripper solution or with an oxygen plasma ashing procedure. The ashing procedure is often followed by a rinsing step that uses a liquid organic stripper solution. However, the stripper solutions currently available, usually alkaline stripper solutions, leave insoluble metal oxides and other metal-containing residues on the integrated circuit.

Another example of such an etching process is the patterning of vias (interconnect holes) on an integrated circuit. In this process, a photoresist coating is applied over a dielectric film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual dielectric etching step is then performmned. This etching step removes dielectric not covered by photoresist through the action of a gaseous plasma. Removal of such dielectric transfers the pattern from the photoresist layer to the dielectric layer. The remaining photoresist is then removed ("stripped") with an organic stripper solution or with an oxygen plasma ashing procedure. Typically, the dielectric is etched to a point where the underlying metal layer is exposed. A titanium or titanium nitride anti-reflective or diffusion barrier layer is typically present at the metal/dielectric boundary. This boundary layer is usually etched through to expose the underlying metal. It has been found that the action of etching through the titanium or titanium nitride layer causes titanium to be incorporated into the etching residues formed inside of the via. Oxygen plasma ashing oxidizes these via residues making them more difficult to remove.

The use of alkaline strippers on microcircuit containing metal films has not always produced quality circuits, particularly when used with metal films containing aluminum or various combinations or alloys of active metals such as aluminum or titanium with more electropositive metals such as copper or tungsten. Various types of metal corrosion, such as corrosion whiskers, pitting, notching of metal lines, have been observed due, at least in part, to reaction of the metals with alkaline strippers. Further it has been shown, by Lee et al., Proc. Interface '89, pp. 137–149, that very little corrosive action takes place until the water rinsing step that is required to remove the organic stripper from the wafer. The corrosion is evidently a result of contacting the metals with the strongly alkaline aqueous solution that is present during rinsing. Aluminum metal is known to corrode rapidly under such conditions, Ambat et al., Corrosion Science, Vol. 33 (5), p. 684. 1992.

Prior methods used to avoid this corrosion problem employed intermediate rinses with non-alkaline organic solvents such as isopropyl alcohol. However, such methods are expensive and have unwanted safety, chemical hygiene, and environmental consequences.

The prior art discloses several organic strippers used to remove bulk photoresist after the etching process. U.S. Pat. Nos. 4,765,844, 5,102,777 and 5,308,745 disclose photoresist strippers comprising various combinations of organic solvents. These strippers, however. are not very effective on wafers that have been "ashed" with oxygen plasmas as described above. Some photoresist strippers attempt to address this problem by adding additional water and an organic corrosion inhibitor such as catechol. Such compositions are disclosed in U.S. Pat. Nos. 5,482,566, 5,279,771, 5,381,807, 5,334,332, 5,709,756, 5,707,947, and 5,419,779 and in WO 9800244. In some cases, the hydrazine derivative, hydroxylamine, is added as well. The use of catechol or hydroxylamine in stripping compositions gives rise to various environmental, safety, and health concerns.

In U.S. Pat. No. 5,817,610 and EP 829,768 the use of a quaternary ammonium silicate, quaternary ammonium hydroxide and water is disclosed for use in removing plasma etch residues. In U.S. Pat. No. 5,759,973 and EP 828,197 the use of a quaternary ammonium silicate, an amine compound, water and optionally an organic polar solvent is disclosed for use as a stripping and cleaning composition. In WO 9960448, many silicate containing compositions are described that effectively remove metal-containing ash residues without causing corrosion.

The use of a quaternary ammonium hydroxide in photoresist strippers is disclosed in U.S. Pat. No. 4,776,892, U.S. Pat. No. 5,563,119; JP 09319098 A2; EP 578507 A2; WO 9117484 A1 and U.S. Pat. No. 4,744,834. The use of chelating and complexing agents to sequester metals in various cleaners has also been reported in WO 9705228, U.S. Pat. No. 5,466,389, U.S. Pat. No. 5,498,293, EP 812011, U.S. Pat. No. 5,561,105, JP 06216098, JP 0641773, JP 06250400 and GB 1,573,206.

U.S. Pat. No. 5,466,389 discloses an aqueous alkaline containing cleaning solution for microelectronics substrates that contains a quaternary ammonium hydroxide and optional metal chelating agents and is useful for a pH range of about 8 to 10. In the present invention, a pH greater than 10 is required to effect the desired residue removal.

U.S. Pat. No. 5,498,293 discloses a process for using an aqueous alkaline cleaning solution that contains a quaternary ammonium hydroxide and optional metal chelating agents useful for cleaning silicon wafers. The disclosure of this cleaning process is for treatments to substrates before the presence of integrated metal circuits and is used to generate a wafer surface that is essentially silicon dioxide free and would be employed before the use of photoresist for integrated circuit fabrication. The present invention, in contrast, focuses on the cleaning of wafers with integrated circuits present which have been photoresist coated, etched, and oxygen plasma ashed.

Although the compositions disclosed in WO 9960448 effectively remove all organic contamination and metal-containing residues remaining after a typical etching process, these compositions have a relatively short bath life. There is, therefore, a need for similar compositions with very long bath lives exceeding twenty hours.

SUMMARY OF THE INVENTION

It is, therefore, an object of the present invention to provide compositions useful in the microelectronics industry for cleaning semiconductor wafer substrates.

It is another object of the present invention to provide compositions that remove metallic and organic contamination from semiconductor wafer substrates without damaging the integrated circuits.

It is another object of the present invention to provide compositions that have very long effective bath lives.

It is a further object of the present invention to provide a method for cleaning semiconductor wafer substrates that removes metallic and organic contamination from such substrates without damaging the integrated circuits and avoiding the expense and adverse consequences caused by intermediate rinses.

These and other objects are achieved using new aqueous compositions for stripping or cleaning semiconductor wafer substrates that contain one or more metal ion-free bases and a bath stabilizing agent. The compositions are placed in contact with a semiconductor wafer substrate for a time and at a temperature sufficient to clean unwanted contaminants and/or residues from the substrate surface.

Preferably, the compositions contain one or more metal ion-free base dissolved in water in sufficient amounts to produce a pH of about 11 or greater and about 0.1% to about 5% by weight of a bath stabilizing agent comprising an acidic compound with at least one pKa in the range of 11–13.

Any suitable base may be used in the compositions of this invention. Preferably, the base is selected from hydroxides and organic amines, most preferably quaternary ammonium hydroxides and ammonium hydroxides.

Any suitable bath stabilizing agent comprising an acidic compound with at least one pKa in the range of 11 to 13, may be used in the compositions of the present invention. The bath stabilizing agents are preferably acid compounds with at least one pKa in the range of 11.5 to 12.5. The most preferable of these acidic compounds are hydrogen peroxide, salicylic acid, sulfosalicylic acid, and phosphoric acid.

The compositions of the present invention may contain other components such as silicates, chelating agents, organic co-solvents. and surfactants. Chelating agents are preferably present in amounts up to about 2% by weight, organic co-solvents are preferably present in amounts up to about 30% by weight. The compositions can be used to clean substrates containing integrated circuits or can be used to clean substrates that do not contain integrated circuits. When integrated circuits are present, the composition removes the contaminants without damaging the integrated circuits.

The method for cleaning semiconductor wafer substrates of the present invention requires that the compositions of the present invention be placed in contact with a semiconductor wafer substrate for a time and at a temperature sufficient to clean unwanted contaminants and/or residues from the substrate surface. The method includes both bath and spray applications. Typically, the substrate is exposed to the composition for the appropriate time and at the appropriate temperature, rinsed using high purity de-ionized water, and dried.

The compositions clean wafer substrates by removing metallic and organic contamination. Importantly, the cleaning process does not damage integrated circuits on the wafer substrates and avoids the expense and adverse consequences associated with intermediate rinses required in prior methods.

Other objects, advantages, and novel features of the present invention will become apparent in the following detailed description of the invention.

DETAILED DESCRIPTION OF THE INVENTION

The present invention provides new aqueous compositions for stripping or cleaning semiconductor wafer substrates that contain one or more metal ion-free bases and one or more bath stabilizing agents comprising an acidic compound with at least one pKa in the range of 11–13. Preferably, the invention provides aqueous, alkaline stripping or cleaning compositions comprising one or more alkaline metal ion-free base components in an amount sufficient to produce a solution pH of about 11 or greater, preferably from about pH 11 to about pH 13, and one or more bath stabilizing agents comprising an acidic compound with at least one pKa in the range of 11–13 in a concentration by weight of about 0.1% to about 5%, preferably from about 0.5% to about 3%.

The compositions may also contain a water-soluble metal ion-free silicate in a concentration by weight of about 0.01% to 5%, and a chelating agent in a concentration by weight of about 0.01% to about 10%, generally from about 0.01% to about 2%. Further optional components are water-soluble organic solvents in a concentration by weight of about 0.1% to about 80%, generally about 1% to about 30%, and a water-soluble surfactant in an amount by weight of about 0.01% to about 1%, preferably about 0.01% to about 0.5%.

The composition is an aqueous solution containing the base, the bath stabilizing agent, the optional components, if any, and water, preferably high purity de-ionized water. Any suitable base may be used in the compositions of the present invention. The bases are preferably quaternary ammonium hydroxides, such as tetraalkyl ammonium hydroxides (including hydroxy- and alkoxy-containing alkyl groups generally of from 1 to 4 carbon atoms in the alkyl or alkoxy group). The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylcthyl-2-hydroxyethyl ammonium hydroxide, dimethyldi(2-hydroxyethyl) ammonium hydroxide, monomethyltriethanol ammonium hydroxide, tetraethyl ammonium hydroxide, tetrapropyl ammonium hydroxide, tetrabutyl ammonium hydroxide, tetraethanol ammonium hydroxide, monomethyltriethyl ammonium hydroxide, monomethyltripropyl ammonium hydroxide, monomethyltributyl ammonium hydroxide, monoethyltrimethyl ammonium hydroxide. monoethyltributyl ammonium hydroxide, dimethyldiethyl ammonium hydroxide, dimethyldibutyl ammonium hydroxide, and the like and mixtures thereof.

Other bases that will function in the present invention include ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino) ethylamine and the like, and other strong organic bases such as guanidine, 1,3-pentanediamine, 4-aminomethyl-1,8-octanediamine, aminoethylpiperazine, 4-(3-aminopropyl) morpholine, 1,2-diaminocyclohexane, tris(2-aminoethyl) amine, 2-methyl-1,5-pentanediamine and hydroxylamine. Alkaline solutions containing metal ions such as sodium or potassium may also be operative, but are not preferred because of the possible residual metal contamination that could occur. Mixtures of these additional alkaline components, particularly ammonium hydroxide, with the aforementioned tetraalkyl ammonium hydroxides are also useful.

Any suitable bath stabilizing agent comprising an acidic compound with at least one pKa in the range of 11 to 13, may be used in the compositions of the present invention. The bath stabilizing agents are preferably acid compounds with at least one pKa in the range of 11.5 to 12.5. The most preferable of these acidic compounds are hydrogen peroxide, salicylic acid, sulfosalicylic acid, and phosphoric acid. Other examples of bath stabilizing agents with a pKa in the preferred range of 11.5 to 12.5 are: hydrogen germanate, acetone oxime, adenosine, cytosine, arabinose, arginine, ascorbic acid, benzil-α-dioxime, benzimidazole, benzoylhydrazine, benzoylpyruvic acid. berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, cyrtosine, 2-deoxyglucose, diethylbiguanide, resorcinol, diguanide, hydroquinone, 3,4-dihydroxybenzoic acid, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, formyl-3-methoxypyridine, fructose, galactose, glucose, guanine, guanosine, 2-hydroxybenzaldehyde oxime, N-(hydroxyethyl)biguanide, 2-hydroxypyridine, 2-hydroxyquinoline, hypoxanthene, inosine, 5-iodohistamine, lyxose, mannose, 2,2'-methylenebis(4-chlorophenol), 2-methyl-8-hydroxyquinoline, 4-methyl-8-hydroxyquinoline, 1-methylxanthine, phenylalanylarginine, ribofuranose, silicic acid, sorbose, sparteine, thorin, toluhydroquinone, pyrogallol, tyrosylarginine, xanthosine, xylose, 2-pyridone, acetamidine, trifluoroethanol, trichlorocthanol, pyridine-4-aldehyde.

Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits.

The compositions of the present invention may also be formulated with suitable metal chelating agents to increase the capacity of the formulation to retain metals in solution and to enhance the dissolution of metallic residues on the wafer substrate. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra (methylenephosphonic) acid (EDTMP), triethylenetetraminehexaacetic acid (TTFIA), 1,3-diamino-2-hydroxypropane-N,N,N,N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine.

Preferred chelating agents are aminocarboxylic acids such as EDTA. Chelating agents of this class have a high affinity for the aluminum-containing residues typically found on metal lines and vias after plasma "ashing". In addition, the pKa's for this class of chelating agents typically include one pKa of approximately 12 which improves the performance of the compositions of the invention.

The compositions of the present invention may also contain one or more suitable water-soluble organic solvents.

Among the various organic solvents suitable are alcohols, polyhydroxy alcohols, glycols, glycol ethers, alkyl-pyrrolidinones such as N-methylpyrrolidinone (NMP), 1-hydroxyalkyl-2-pyrrolidinones such as 1-(2-hydroxyethyl)-2-pyrrolidinone (HEP), dimethylformamide (DMF), dimethylacetamide (DMAc), sulfolane or dimethylsulfoxide (DMSO). These solvents may be added to reduce aluminum andJor aluminum-copper alloy and/or copper corrosion rates if further aluminum and/or aluminum-copper alloy and/or copper corrosion inhibition is desired. Preferred water-soluble organic solvents are polyhydroxy alcohols such as glycerol and/or 1-hydroxyalkyl-2-pyrrolidinones such as 1-(2-hydroxyethyl)-2-pyrrolidinone (HEP).

The compositions of the present invention may also contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired.

Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof Preferably, the amphoteric surfactants are cocoamidopropyl betaine, cocoamidopropyl dimethyl betaine, cocoamidopropyl hydroxy sultaine, capryloamphodipropionatc, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics.

Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols.

Anionic surfactants useful in the compositions of the present invention include carboxylates, N-acylsarcosinates, sulfonates, sulfatcs, and mono and diesters of orthophosphoric acid such as decyl phosphate. Preferably, the anionic surfactants are metal-free surfactants.

Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants.

In the preferred embodiment of the present invention, the composition is an aqueous solution containing about 0.1–7%, more preferably about 0.1–5%, by weight tetramethylammonium hydroxide (TMAH) and about 0.1% to about 3% by weight sulfosalicylic acid or phosphoric acid.

In another embodiment of the present invention, the composition is an aqueous solution containing about 0.1–5% by weight tetramethylammonium hydroxide (TMAH), about 0.1% to about 3% by weight sulfosalicylic acid or phosphoric acid, about 0.01–1% by weight trans-(1,2-cyclohexylenedinitrilo)tetraacetic acid (CyDTA), and about 0.01–1% by weight (calculated as % $SiO_2$) tetramethylammonium silicate (TMAS).

In another embodiment of the present invention, the composition is an aqueous solution containing about 0.1–5% by weight tetramethylammonium hydroxide (TMAH), about 0.01–1% by weight trans-(1,2-cyclohexylenedinitrilo)tetraacetic acid (CyDTA), about 0.1% to about 3% by weight sulfosalicylic acid or phosphoric acid, about 0.01–1% by weight (calculated as % $SiO_2$) tetramethylammonium silicate (TMAS), and about 0.5–30% by weight of polyhydroxy compounds, preferably glycerol.

In another embodiment of the present invention, the composition is an aqueous solution containing about 0.1–3% by weight tetramethylammonium hydroxide (TMAH), about 0.1% to about 3% by weight sulfosalicylic acid or phosphoric acid, about 0.01–1% by weight trans-(1,2-cyclohexylenedinitrilo)tetraacetic acid (CyDTA), about 0.01–1% by weight (calculated as % $SiO_2$) tetramethylammonium silicate (TMAS), about 0.5–30% by weight of polyhydroxy compounds, and about 0.01–0.3% by weight of a nonionic ethoxylated acetylenic diol surfactant.

In another embodiment of the present invention, the composition is an aqueous solution containing about 0.1–5% by weight tetramethylammonium hydroxide (TMAH), about 0.1% to about 3% by weight hydrogen peroxide or salicylic acid, about 0.01–1% by weight trans-(1,2-cyclohexylenedinitrilo)tetraacetic acid (CyDTA), and about 0.01–1% by weight (calculated as % $SiO_2$) tetramethylammonium silicate (TMAS).

In another embodiment of the present invention, the composition is an aqueous solution containing about 0.1–5% by weight tetramethylammonium hydroxide (TMAH), about 0.01–1% by weight trans-(1,2-cyclohexylenedinitrilo) tetraacetic acid (CyDTA), about 0.1% to about 3% by weight hydrogen peroxide or salicylic acid, about 0.01–1% by weight (calculated as % $SiO_2$) tetramethylammonium silicate (TMAS), and about 0.5–30% by weight of polyhydroxy compounds, preferably glycerol.

In another embodiment of the present invention, the composition is an aqueous solution containing about 0.1–3% by weight tetramethylammonium hydroxide (TMAH), about 0.1% to about 3% by weight hydrogen peroxide or salicylic acid, about 0.01–1% by weight trans-(1,2-cyclohexylencdinitrilo)tetraacetic acid (CyDTA), about 0.01–1% by weight (calculated as % $SiO_2$) tetramethylammonium silicate (TMAS), about 0.5–30% by weight of polyhydroxy compounds, and about 0.01–0.3% by weight of a nonionic ethoxylated acetylenic diol surfactant.

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.01–1% by weight (calculated as % SiO2) tetramethylammonium silicate (TMAS), about 0.1% to about 3% by weight hydrogen peroxide or salicvlic acid and about 0.5–30% by weight of an alkyl-pyrrolidinone such as 1-(2-hydroxyethyl)-2-pyrrolidinone (HEP), preferably 1-(2-hydroxyethyl)-2-pyrrolidinone (HEP).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.01–1% by weight (calculated as % $SiO_2$) tetramethylammonium silicate (TMAS), about 0.1% to about 3% by weight hydrogen peroxide or salicylic acid, about 0.5–30% by weight of an alkyl-pyrrolidinone such as 1-(2-hydroxyethyl)-2-pyrrolidinone (HEP), and about 0.01–0.3% by weight of a nonionic ethoxylated acetylenic diol surfactant.

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.1% to about 3% by weight sulfosalicylic acid or phosphoric acid, about 0.01–1% by weight (calculated as % $SiO_2$) tetramethylammonium silicate (TMAS), and about 0.5–30% by weight of an alkyl-pyrrolidinone such as 1-(2-hydroxyethyl)-2-pyrrolidinone (IIEP), preferably 1-(2-hydroxyethyl)-2-pyrrolidinone (HFP).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.1% to about 3% by weight sulfosalicylic acid or phosphoric acid, about 0.01–1% by weight (calculated as % $SiO_2$) tetramethylammonium silicate (TMAS), about 0.5–30% by weight of an alkyl-pyrrolidinone such as 1-(2-hydroxyethyl)-2-pyrrolidinone (HEP), and about 0.01–0.3% by weight of a nonionic ethoxylated acetylenic diol surfactant.

In all the embodiments, the balance of the composition is made up with water, preferably high purity de-ionized water.

The method of the present invention cleans semiconductor wafer substrates by exposing the contaminated substrate to the compositions of the present invention for a time and at a temperature sufficient to clean unwanted contaminants from the substrate surface. Optionally, the substrate is rinsed to remove the composition and the contaminants and dried to remove any excess solvents or rinsing agents. The substrate can then be used for its intended purpose. Preferably, the method uses a bath or spray application to expose the substrate to the composition. Bath or spray cleaning times are generally 1 minute to 30 minutes, preferably 5 minutes to 20 minutes. Bath or spray cleaning temperatures are generally 10° C. to 85° C., preferably 20° C. to 65° C.

If required, the rinse times are generally 10 seconds to 5 minutes at room temperature, preferably 30 seconds to 2 minutes at room temperature. Preferably de-ionized water is used to rinse the substrates.

If required, drying the substrate can be accomplished using any combination of air-evaporation, heat, spinning, or pressurized gas. The preferred drying technique is spinning under a filtered inert gas flow, such as nitrogen, for a period of time until the wafer substrate is dry.

The method of the present invention is very effective for cleaning semiconductor wafer substrates that have been previously oxygen plasma ashed to remove bulk photoresist, particularly wafer substrates containing a silicon, silicon oxide, silicon nitride, tungsten, tungsten alloy, titanium, titanium alloy, tantalum, tantalum alloy, copper, copper alloy, aluminum or aluminum alloy film. The method removes unwanted metallic and organic contaminants but does not cause unacceptable corrosion to the silicon, silicon oxide, silicon nitride, tungsten, tungsten alloy, titanium, titanium alloy, tantalum, tantalum alloy, copper, copper alloy, aluminum or aluminum alloy film.

The following examples illustrate the specific embodiment of the invention described in this document. As would be apparent to skilled artisans, various changes and modifications are possible and are contemplated within the scope of the invention described.

EXPERIMENTAL PROCEDURES

The percentages given in the examples are by weight unless specified otherwise. The amount of aluminum or aluminum-copper alloy metal corrosion is expressed as both percent metal loss and as a general corrosion remark. The general corrosion remarks given are very slight, slight, light, moderate and severe. A small amount of metal corrosion that was considered to be within acceptable limits were assigned very slight or slight. Light, moderate or severe corrosion were considered to be unacceptable. All cleaning and corrosion data entries generated using Field Emission Scanning Electron Microscope (FE-SEM) were based on a visual interpretation of differences between untreated and treated samples from the same wafer.

EXAMPLE 1

Aqueous solution "A1" was prepared with 2.4 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 3.0 weight percent glycerol and 0.9 weight percent salicylic acid (remainder of this solution being made up with de-ionized water) and has a pH of about 12.5.

Aqueous solution "A2" was prepared with 3.2 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 3.0 weight percent glycerol and 2.2 weight percent salicylic acid (remainder of this solution being made up with de-ionized water) and has a pH of about 12.5.

Aqueous solution "A3" was prepared with 1.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol and 0.9 weight percent salicylic acid (remainder of this solution being made up with de-ionized water) and has a pH of about 12.5.

Aqueous solution "A4" was prepared with 9.2 weight percent tetramethylammonium hydroxide (TMAH), 0.06 weight percent of the non-ionic surfactant Surfynol-465 (a product of Air Products and Chemicals, Inc.), 0.9 weight percent glacial acetic acid, 3.0 weight percent glycerol and 0.9 weight percent salicylic acid (remainder of this solution being made up with de-ionized water) and has a pH of about 12.5.

Aqueous solution "A5" was prepared with 2.4 weight percent tetramethylammonium hydroxide (TMAH), 0.1 weight percent trans-(1,2-cyclohexylenedinitrilo)tetraacetic acid (CyDTA), 0.9 weight percent glacial acetic acid, 3.0 weight percent glycerol and 0.9 weight percent salicylic acid (remainder of this solution being made up with de-ionized water) and has a pH of about 12.5.

Aqueous solution "A6" was prepared with 4.2 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 2.2 weight percent glacial acetic acid, 3.0 weight percent glycerol and 0.9 weight percent salicylic acid (remainder of this solution being made up with de-ionized water) and has a pH of about 12.5.

Aqueous solution "A7" was prepared with 3.1 weight percent tetramethylammonium hydroxide (TMAH), 1.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 3.0 weight percent glycerol and 0.9 weight percent salicylic acid (remainder of this solution being made up with de-ionized water) and has a pH of about 12.5.

Aqueous solution "A8" was prepared with 2.4 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 1.0 weight percent glacial acetic acid and 1.0 weight percent salicylic acid (remainder of this solution being made up with de-ionized water).

Aqueous solution "A9" was prepared with 2.3 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 0.9 weight percent glacial acetic acid, 6.0 weight percent glycerol and 0.9 weight percent salicylic acid (remainder of this solution being made up with de-ionized water).

Aqueous solution "A10" was prepared with 2.1 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 0.9 weight percent glacial acetic acid, 3.0 weight percent glycerol and 0.9 weight percent acetone oxime (remainder of this solution being made up with de-ionized water) and has a pH of about 12.3.

Aqueous solution "A11" was prepared with 2.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol and 0.8 weight percent phosphoric acid (remainder of this solution being made up with de-ionized water) and has a pH of about 12.2.

Wafer #1 samples with 0.35 micron wide via features had been previously prepared using a via-first dual-damascene process with the following layers present: Si wafer base, copper metal, silicon nitride, fluorinated silica glass (FSG) dielectric, silicon nitride etch-stop, FSG and anti-reflective coating (ARC) layers. Lithographic patterning was done using a deep ultraviolet (DUV) photoresist material. Reactive ion etching for pattern transfer was followed by oxygen plasma ashing to remove organic photoresist residues, but leaving mainly inorganic residues behind. A wafer sample was placed in each of these solutions at 24–55° C. for 20 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the copper metal features. The results are shown in Table 1.

TABLE 1

FE-SEM Evaluation Results

| Solution | Description | Bath Stabilizing Agent Used | pKa of Bath Stabilizing Agent Used (at 25° C.) | Temp. (° C.) | Post-Ash Residue Removed (%) | Copper Metal Corrosion (% Metal Loss) |
|---|---|---|---|---|---|---|
| A1 | No silicate content | Salicylic Acid | $pKa_2 = 12.4$ | 24 | 88 | 1 (very slight) |
|  |  |  |  | 35 | 100 | 3 (very slight) |
|  |  |  |  | 45 | 100 | 3 (very slight) |
|  |  |  |  | 55 | 100 | 4 (very slight) |
| A2 | A1 with 2.4x amount of bath stabilizing agent | Salicylic Acid | $pKa_2 = 12.4$ | 45 | 100 | 7 (slight) |
| A3 | A1 with acetic acid removed | Salicylic Acid | $pKa_2 = 12.4$ | 45 | 100 | 5 (slight) |
| A4 | A1 with chelating agent removed | Salicylic Acid | $pKa_2 = 12.4$ | 45 | 100 | 4 (very slight) |
| A5 | A1 with surfactant removed | Salicylic Acid | $pKa_2 = 12.4$ | 45 | 100 | 7 (slight) |
| A6 | A1 with 2.4x amount of acetic acid | Salicylic Acid | $pKa_2 = 12.4$ | 45 | 100 | 5 (slight) |
| A7 | A1 with 10x amount of chelating agent | Salicylic Acid | $pKa_2 = 12.4$ | 45 | 100 | 7 (slight) |
| A8 | A1 with co-solvent removed | Salicylic Acid | $pKa_2 = 12.4$ | 24 | 98 | 1 (very slight) |

TABLE 1-continued

FE-SEM Evaluation Results

| Solution | Description | Bath Stabilizing Agent Used | pKa of Bath Stabilizing Agent Used (at 25° C.) | Temp. (° C.) | Post-Ash Residue Removed (%) | Copper Metal Corrosion (% Metal Loss) |
|---|---|---|---|---|---|---|
| | | | | 35 | 100 | 3 (very slight) |
| | | | | 45 | 100 | 5 (slight) |
| A9 | A1 with 2x amount of co-solvent added | Salicylic Acid | $pKa_2 = 12.4$ | 45 | 100 | 3 (very slight) |
| A10 | A1 with acetone oxime bath stabilizer substituted for salicylic acid | Acetone Oxime | $pKa = 12.2$ | 45 | 100 | 6 (slight) |
| A11 | A1 with phosphoric acid bath stabilizer substituted for salicylic acid | Phosphoric Acid | $pKa_3 = 12.3$ | 45 | 99 | (very slight) |

Referring to Table 1, the data shows the ability of stabilized, aqueous, alkaline solutions to successfully remove post-etch/ash residues from a semiconductor wafer over a temperature range of about 24–55° C. This table also shows the ability to substitute different bath stabilizing agents and still maintain the cleaning efficiency of the solution.

EXAMPLE 2

Aqueous solution "B1" was prepared with 2.5 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.14 weight percent (calculated as % $SiO_2$) tetramethylammonium silicate (TMAS), 0.95 weight percent glacial acetic acid and 0.8 weight percent 5-sulfosalicylic acid (remainder of this solution being made up with de-ionized water) and has a pH of about 12.1.

Aqueous solution "B2" was prepared with 1.1 weight percent tetramethylammonium hydroxide (TMAH), 0.1 weight percent trans-(1,2-cyclohexylenedinitrilo)tetraacetic acid (CyDTA), 0.08 weight percent of the non-ionic surfactant Surfynol-465 (a product of Air Products and Chemicals, Inc.), 3.0 weight percent glycerol, 0.14 weight percent (calculated as % $SiO_2$) tetramethylammonium silicate (TMAS) and 0.8 weight percent 5-sulfosalicylic acid (remainder of this solution being made up with de-ionized water) and has a pH of about 12.1.

Aqueous solution "B3" was prepared with 3.2 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.14 weight percent (calculated as % $SiO_2$) tetramethylammonium silicate (TMAS) and 2.9 weight percent 5-sulfosalicylic acid (remainder of this solution being made up with de-ionized water) and has a pH of about 12.1.

Aqueous solution "B4" was prepared with 1.9 weight percent tetramethylammonium hydroxide (TMAH), 0.08 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 24 weight percent glycerol, 0.11 weight percent (calculated as % $SiO_2$) tetramethylammonium silicate (TMAS), 0.7 weight percent glacial acetic acid and 0.6 weight percent 5-sulfosalicylic acid (remainder of this solution being made up with de-ionized water).

Aqueous solution "B5" was prepared with 1.9 weight percent tetramethylammonium hydroxide (TMAH), 0.08 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 27 weight percent glycerol, 0.10 weight percent (calculated as % $SiO_2$) tetramethylammonium silicate (TMAS), 0.7 weight percent glacial acetic acid and 0.6 weight percent 5-sulfosalicylic acid (remainder of this solution being made up with de-ionized water).

Aqueous solution "C" was prepared with 2.5 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 1.0 weight percent (calculated as % $SiO_2$) tetramethylammonium silicate (TMAS), 0.9 weight percentglacial acetic acid and 0.9 weight percent salicylic acid (remainder of this solution being made up with de-ionized water) and has a pH of about 12.5.

Aqueous solution "D" was prepared with 3.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.28 weight percent (calculated as % $SiO_2$) tetramethylammonium silicate (TMAS) and 3.0 weight percent 5-sulfosalicylic acid (remainder of this solution being made up with de-ionized water) and has a pH of about 12.1.

Aqueous solution "E1" was prepared with 3.2 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol, 0.22 weight percent (calculated as % $SiO_2$) tetramethylammonium silicate (TMAS) and 2.9 weight percent 5-sulfosalicylic acid (remainder of this solution being made up with de-ionized water) and has a pH of about 12.1.

Aqueous solution "E2" was prepared with 3.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 9.0 weight percent glycerol, 0.21 weight percent (calculated as % $SiO_2$) tetramethylammonium silicate (TMAS) and 2.8 weight percent 5-sulfosalicylic acid (remainder of this solution being made up with de-ionized water).

Aqueous solution "'E3" was prepared with 2.7 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 18 weight percent glycerol, 0.12 weight percent (calculated as % $SiO_2$) tetramethylammonium silicate (TMAS) and 2.5 weight percent 5-sulfosalicylic acid (remainder of this solution being made up with de-ionized water).

Aqueous solution "F1" was prepared with 4.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals. Inc.), 3.0 weight percent glycerol, 0.28 weight percent (calculated as % $SiO_2$) tetramethylammonium silicate (TMAS) and 1.6 weight percent phosphoric acid (remainder of this solution being made up with de-ionized water) and has a pll of about 12.1.

Aqueous solution "F2" was prepared with 2.5 weight percent tetramethylammonium hydroxide (FMAHI), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 0.26 weight percent (calculated as % $SiO_2$) tetramethylammonium silicate (TMAS) and 0.97 weight percent phosphoric acid (remainder of this solution being made up with de-ionized water) and has a pH of about 12.1.

Aqueous solution "F3" was prepared with 1.5 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 (a product of Air Products and Chemicals, Inc.), 3.0 weight percent glycerol, 0.22 weight percent (calculated as % $SiO_2$) tetramethylammonium silicate (TMAS) and 0.53 weight percent phosphoric acid (remainder of this solution being made up with de-ionized water) and has a pH of about 12.1.

Aqueous solution "G" was prepared with 2.0 weight percent tetramethylammonium hydroxide (TMAH), 0.1 weight percent trans-(1,2-cyclohexylenedinitrilo)tetraacetic acid (CyDTA), 0.15 weight percent (calculated as % $SiO_2$) tetramethylammonium silicate (TMAS) and 1.6 weight percent hydrogen peroxide (remainder of this solution being made up with de-ionized water) and has a pH of about 11.5.

Wafer #1 samples with 0.35 micron wide via features had been previously prepared using a via-first dual-damascene process with the following layers present: Si wafer base, copper metal, silicon nitride, fluorinated silica glass (FSG) dielectric, silicon nitride etch-stop, FSG and anti-reflective coating (ARC) layers. Lithographic patterning was done using a deep ultraviolet (DUV) photoresist material. Reactive ion etching for pattern transfer was followed by oxygen plasma ashing to remove organic photoresist residues, but leaving mainly inorganic residues behind. Wafer #2 samples with one micron wide features and Aluminum-Copper raised lines capped with titanium-nitride, were previously prepared as follows: (a) a coating of spin-on-glass was applied to a silicon wafer and cured (b) a titanium adhesion layer was applied (c) a titanium nitride layer was deposited (d) metallization with an aluminum-1% copper alloy (e) a titanium nitride capping layer was deposited (f) lithographic patterning using a photoresist material (g) pattern transfer using reactive ion etching and (h) oxygen plasma ashing to remove organic photoresist residues, but leaving mainly inorganic residues behind. Wafer samples #3 through #6 have 0.35 micron wide features and Aluminum-Copper raised lines capped with titanium-nitride, were previously prepared as follows: (a) a coating of spin-on-glass was applied to a silicon wafer and cured (b) a titanium adhesion layer was applied (c) a titanium nitride layer was deposited (d) metallization with an aluminum-1% copper alloy (e) a titanium nitride capping layer was deposited (f) lithographic patterning using a photoresist material (g) pattern transfer using reactive ion etching and (h) oxygen plasma ashing to remove organic photoresist residues, but leaving mainly inorganic residues behind. Wafer sample #7 with 0.3–0.5 micron wide by 0.5 micron deep holes (vias) through dielectric and titanium nitride layers exposing aluminum-copper alloy metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ioIn etching (e) oxygen plasma ashing to remove most of the residual photoresist, but leaving mainly inorganic residues behind, were used to evaluate the performance of the solutions. A wafer sample was placed in each of these solutions at 22–65° C. for 10–60 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the metal features. The results are shown in Table 2.

TABLE 2

FE-SEM Evaluation Results

| Solution | Description | Bath Stabilizing Agent Used | pKa of Bath Stabilizing Agent Used (at 25° C.) | Wafer Sample Number Tested (1 = Cu-based, 2 – 7 = Al/Cu alloy based) | Time (min.)/ Temp. (° C.) | Post-Ash Residue Removed (%) | Copper Metal Corrosion (% Metal Loss) |
|---|---|---|---|---|---|---|---|
| B1 | Contains silicate. | 5-sulfosalicylic Acid | $pKa_2 = 12.0$ | 2 | 10/22 | 100 | 0 |
|  |  |  |  | 1 | 20/35 | 95 | 0 |
|  |  |  |  | 1 | 20/45 | 100 | 4 (very slight) |
|  |  |  |  | 1 | 20/55 | 100 | 6 (slight) |
|  |  |  |  | 3 | 20/25 | 100 | 15 (light) |
| B2 | B1 with acetic acid removed | 5-sulfosalicylic Acid | $pKa_2 = 12.0$ | 2 | 10/22 | 100 | 1 (very slight) |
|  |  |  |  | 1 | 20/35 | 98 | 1 (very slight) |
|  |  |  |  | 1 | 20/45 | 100 | 5 (slight) |
|  |  |  |  | 1 | 20/55 | 100 | 7 (slight) |
| B3 | B1 with 3.6x amount of bath stabilizing agent | 5-sulfosalicylic Acid | $pKa_2 = 12.0$ | 2 | 10/22 | 100 | 1 (very slight) |
|  |  |  |  | 1 | 20/24 | 50 | 0 |
|  |  |  |  | 1 | 20/35 | 70 | 0 |
|  |  |  |  | 1 | 20/45 | 100 | 5 (slight) |
|  |  |  |  | 1 | 20/55 | 100 | 7 (slight) |
|  |  |  |  | 1 | 20/65 | 100 | 10 (light) |
| B4 | B1 with 6x co-solvent added | 5-sulfosalicylic Acid | $pKa_2 = 12.0$ | 3 | 60/35 | 100 | 5 (slight) |
| B5 | B1 with 7x co-solvent added | 5-sulfosalicylic Acid | $pKa_2 = 12.0$ | 3 | 60/35 | 100 | 3 (very slight) |
| B6 | B1 with 8x co-solvent added | 5-sulfosalicylic Acid | $pKa_2 = 12.0$ | 3 | 60/35 | 99 | 0 |
| B7 | B1 with 9x co-solvent added | 5-sulfosalicylic Acid | $pKa_2 = 12.0$ | 3 | 60/35 | 95 | 0 |
| C | Contains silicate. | salicylic acid | $pKa_2 = 12.4$ | 2 | 10/22 | 100 | 0 |
|  |  |  |  | 1 | 20/35 | 90 | 2 (very slight) |
|  |  |  |  | 1 | 20/45 | 99 | 5 (slight) |
|  |  |  |  | 1 | 20/55 | 100 | 5 (slight) |
|  |  |  |  | 1 | 20/65 | 100 | 8 (slight) |
| D | Contains silicate. | 5-sulfosalicytic Acid | $pKa_2 = 12.0$ | 5 | 10/25 | 100 | 0 |
|  |  |  |  | 5 | 40/25 | 100 | 8 (slight) |
| E1 | Contains silicate. | 5-sulfosalicylic Acid | $pKa_2 = 12.0$ | 5 | 10/25 | 100 | 0 |
|  |  |  |  | 5 | 40/25 | 100 | 9 (slight) |
|  |  |  |  | 6 | 20/30 | 100 | 2 (very slight) |

TABLE 2-continued

FE-SEM Evaluation Results

| Solution | Description | Bath Stabilizing Agent Used | pKa of Bath Stabilizing Agent Used (at 25° C.) | Wafer Sample Number Tested (1 = Cu-based, 2 – 7 = Al/Cu alloy based) | Time (min.)/ Temp. (° C.) | Post-Ash Residue Removed (%) | Copper Metal Corrosion (% Metal Loss) |
|---|---|---|---|---|---|---|---|
| E2 | E1 with 3x co-solvent added | 5-sulfosalicylic Acid | $pKa_2 = 12.0$ | 5 | 40/25 | 100 | 1 (very slight) |
| E3 | E1 with 50% silicate content and with 6x co-solvent added | 5-sulfosalicylic Acid | $pKa_2 = 12.0$ | 5 | 40/25 | 100 | 9 (slight) |
| F1 | Contains silicate. | Phosphoric Acid | $pKa_3 = 12.3$ | 5 | 40/25 | 100 | 9 (slight) |
|  |  |  |  | 6 | 15/30 | 100 | 1 (very slight) |
|  |  |  |  | 6 | 20/30 | 100 | 3 (very slight) |
|  |  |  |  | 6 | 10/35 | 100 | 3 (very slight) |
| F2 | F1 with 40% less bath stabilizing agent added | Phosphoric Acid | $pKa_3 = 12.3$ | 5 | 40/25 | 100 | 9 (slight) |
|  |  |  |  | 6 | 15/30 | 100 | 3 (very slight) |
|  |  |  |  | 6 | 20/30 | 100 | 5 (slight) |
|  |  |  |  | 6 | 10/35 | 100 | 5 (slight) |
| F3 | F1 with 66% less bath stabilizing agent added | Phosphoric Acid | $pKa_3 = 12.3$ | 5 | 40/25 | 100 | 9 (slight) |
|  |  |  |  | 6 | 15/30 | 100 | 2 (very slight) |
|  |  |  |  | 6 | 20/30 | 100 | 4 (very slight) |
|  |  |  |  | 6 | 10/35 | 100 | 5 (slight) |
| G | Contains silicate. | Hydrogen Peroxide | $pKa = 11.6$ | 7 | 10/45 | 100 | 5 (slight) |

Referring to Table 2, the data shows the ability of stabilized, aqueous, alkaline solutions containing silicate to successfully remove post-etch/ash residues from a semiconductor wafers over a temperature range of about 25–65° C. This table also shows the ability to substitute different bath stabilizing agents with different pKa values and still maintain the cleaning efficiency of the solution.

EXAMPLE 3

Aqueous solution "H" was prepared (without any bath stabilizing agent added) with 0.2 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.), 3.0 weight percent glycerol and 0.14 weight percent calculated as % $SiO_2$) tetramethylammonium silicate (TMAS) (remainder of this solution being made up with de-ionized water) and has a pH of about 12.0.

Comparative uncovered baths were set up in a chemical fume hood with an air-flow rate of about 100 feet per minute (FPM) over the baths. The temperature of the baths was maintained by use of programmable digital hot plates with a bath temperature monitoring probe. Wafer samples were processed during the aging of the solutions so as to determine its performance bath-life. A description of the solutions used for the comparisons is discussed above in Examples 1 and 2. A wafer sample was placed in each of these solutions at 30–55° C. for 10–20 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the metal features. The bath aging results are shown in Table 3.

TABLE 3

FE-SEM Evaluation Results for Aged Solutions

| Solution | Bath Stabilizing Agent Added | Amount of Bath Stabilizing Agent Added (Weight %) | Bath Aging Temp. (° C.) | Wafer Sample Number | Wafer Sample Process Conditions (min./° C.) | Bath Aging time with Successful Cleaning of Samples (Hours) |
|---|---|---|---|---|---|---|
| H | none | 0 | 35 | 6 | 20/35 | 12 |
| E1 | 5-Sulfosalicylic Acid | 2.9 | 30 | 6 | 20/30 | 28 |
| F1 | Phosphoric Acid | 1.6 | 35 | 6 | 10/35 | 29 |
| F2 | Phosphoric Acid | 0.97 | 30 | 6 | 20/30 | 20 |
| F3 | Phosphoric Acid | 0.53 | 30 | 6 | 20/30 | 24 |
| A1 | Salicylic Acid | 0.93 | 45 | 1 | 20/45 | 24 |
| B1 | 5-Sulfosalicylic Acid | 0.82 | 45 | 1 | 20/45 | 24 |
| C | Salicylic Acid | 0.94 | 55 | 1 | 20/55 | 24 |
| G | Hydrogen Peroxide | 1.6 | 45 | 7 | 10/45 | 24 |

Referring to Table 3, the data clearly shows the ability of stabilized, aqueous, alkaline solutions to successfully remove post-etch/ash residues from semiconductor wafers for a longer period of time in an aged open bath. This table clearly shows that the lack of a stabilizing agent results in a bath-life that is unacceptably short. This table also shows the ability to substitute different bath stabilizing agents and still maintain the cleaning efficiency of the solution.

I claim:

1. An aqueous, alkaline composition for stripping or cleaning integrated circuit substrates, comprising:
   (a) one or more metal ion-free bases in an amount sufficient to produce a pH of the composition of about 11 or greater;
   (b) a bath stabilizing effective amount of a bath stabilizing agent comprising an acidic compound with at least one pKa in the range of 11 to 13;
   (c) water; and
   (d) from about 0.01 to about 5% by weight of the composition of a water-soluble metal ion-free silicate.

2. Thhe composition of claim 1 wherein the metal ion-free bases are present in sufficient amounts to produce a pH of from about 11 to about 13.

3. The composition of claim 1 wherein the bath stabilizing agent comprises an acidic compound with at least one pKa in the range of 11.5 to 12.5.

4. The composition of claim 1 wherein the bath stabilizing agent comprises salicylic acid, sulfosalicylic acid, hydrogen peroxide or phosphoric acid.

5. The composition of claim 1 wherein the bath stabilizing agent is added to a concentration of from 0.1 to 5.0% by weight.

6. The composition of claim 1 further containing one or more chelating agents.

7. The composition of claim 6 wherein the concentration of chelating agents is from about 0.01% to about 10% by weight.

8. The composition of claim 6 wherein the chelating agent is an aminocarboxylic acid.

9. The composition of claim 6 wherein the chelating agent is selected from the group consisting of (ethylenedinitrilo) tetraacetic acid, diethylenetriaminepentaacetic acid, triethylenetetraminehexaacetic acid, 1,3-diamino-2-hydroxypropane-N,N,N',N'-tetraacetic acid, N,N,N',N'-ethylenediaminetetra(methylenephosphonic acid), cis-1,2-cyclohexylenedinitrilo)tetraacetic acid and trans-(1,2-cyclohexylenedinitrilo)tetraacetic acid.

10. The composition of claim 1 further containing one or more water-soluble organic co-solvents.

11. The composition of claim 10 wherein the concentration of water-soluble organic co-solvents is from about 0.1% to about 30% by weight.

12. The composition of claim 10 wherein said water-soluble organic co-solvent is selected from the group consisting of 1-hydroxyalkyl-2-pyrrolidinones, alcohols and polyvydroxy compounds.

13. The composition of claim 10 wherein said water-soluble organic co-solvent is glycerol.

14. The composition of claim 1 further containing one or more water-soluble surfactants.

15. The composition of claim 14 wherein the concentration of water-soluble surfactants is from about 0.01% to about 1% by weight.

16. The composition of claim 1 wherein the base is selected from the group consisting of hydroxides and organic amines.

17. The composition of claim 16 wherein the base is selected from the group consisting of quaternary ammonium hydroxides, ammonium hydroxides, and organic amines.

18. The composition of claim 1 wherein the base is selected from the group consisting of choline, tetrabutylammonium hydroxide, tetramethylammonium hydroxide, monomethyltriethanolammonium hydroxide, monomethyltriethylammonium hydroxide, tetraethylammonium hydroxide, tetrapropylammonium hydroxide and tetraethanolammonium hydroxide.

19. The composition of claim 1 wherein the water-soluble metal ion-free silicate is selected from the group consisting of ammonium silicates and quaternary ammonium silicates.

20. The composition of claim 1 wherein the water-soluble metal ion-free silicate is tetramethylammonium silicate.

21. The composition of claim 1 containing from about 0.1–7% by weight tetramethylammonium hydroxide and about 0.01–1% by weight of tetramethylammonium silicate.

22. The composition of claim 21 further containing from about 0.01–1% by weight trans-(1,2-cyclohexylenedinitrilo) tetraacetic acid.

23. A method for cleaning semiconductor wafer substrates having copper, aluminum or alloys thereof present, comprising:
  contacting such a semiconductor wafer substrate having a substrate surface for a time and at a temperature sufficient to clean unwanted contaminants and residues from said substrate surface with an aqueous, alkaline composition comprising:
  (a) one or more metal ion-free bases in an amount sufficient to produce a pH of the composition of about 11 or greater;
  (b) a bath stabilizing effective amount of one or more bath stabilizing agents comprising an acidic compound with at least one pKa in the range of 11 to 13; and
  (c) water;
  with the proviso than when the semiconductor wafer substrate has aluminum or aluminum alloy present the composition also contains from about 0.01 to about 5% by weight of the composition of a water soluble, metal ion-free silicate.

24. The methodof claim 23 wherein the semiconductor wafer substrate is in contact with the composition for from about 1 to about 30 minutes.

25. The method of claim 23 wherein the semiconductor wafer substrate is in contact with the composition at a temperature of from about 10° C. to about 85° C.

26. The method of claim 23 further comprising a rinsing and a drying step.

27. The method of claim 23 wherein the composition contains metal ion-free bases in sufficient amounts to produce a pH of from about 11 to about 13.

28. The method of claim 23 wherein the bath stabilizing agent comprises an acidic compound with at least one pKa in the range of 11.5 to 12.5.

29. The method of claim 23 wherein the bath stabilizing agent comprises salicylic acid, sulfosalicylic acid, hydrogen peroxide or phosphoric acid.

30. The method of claim 23 wherein the bath stabilizing agent is added to a concentration of from 0.1 to 5.0% by weight.

31. The method of claim 23 further containing one or more chelating agents in the composition.

32. The method of claim 31 wherein the concentration of chelating agents is from about 0.01% to about 10% by weight.

33. The method of claim 31 wherein the chelating agent is an aminocarboxylic acid.

34. The method of claim 31 wherein the chelating agent is selected from the group consisting of (ethylenedinitrilo) tetraacetic acid, diethylenetriaminepentaacetic acid, triethylenetraminehexaacetic acid, 1,3-diamino-2-hydroxypropane-N,N,N',N'-tetraacetic acid, N,N,N',N'-ethylenediaminetetra(methylenephosphonic acid), cis-(1,2-cyclohexylenedinitrilo)tetraacetic acid and trans-(1,2-cyclohexylenedinitrilo)tetraacetic acid.

35. The method of claim 23 further containing one or more water-soluble organic co-solvents in the composition.

36. The method of claim 35 wherein the concentration of water-soluble organic co-solvents is from about 0.1% to about 30% by weight.

37. The method of claim 35 wherein said water-soluble organic co-solvent is selected from the group consisting of 1-hydroxyalkyl-2-pyrrolidinones, alcohols and polyhydroxy compounds.

38. The method of claim 35 wherein said water-soluble organic co-solvent is glycerol.

39. The method of claim 23 further containing one or more water-soluble surfactants in the composition.

40. The method of claim 39 further wherein the concentration of water-soluble surfactants is from about 0.01% to about 1% by weight.

41. The method of claim 23 wherein the base in the composition is selected from the group consisting of hydroxides and organic amines.

42. The method of claim 41 wherein the base in the composition is selected from the group consisting of quaternary ammonium hydroxides, ammonium hydroxides, and organic amines.

43. The method of claim 23 wherein the base in the composition is selected from the group consisting of choline, tetrabutylammonium hydroxide, tetramethylammonium hydroxide, monomethyltriethanolammonium hydroxide, monomethyltriethylammonium hydroxide, tetraethylammonium hydroxide, tetrapropylammonium hydroxide and tetraethanolammonium hydroxide.

44. The method of claim 23 wherein the water-soluble metal ion-free silicate in the composition is selected from the group consisting of ammonium silicates and quaternary ammonium silicates.

45. The method of claim 23 wherein the water-soluble metal ion-free silicate in the composition is tetramethylammonium silicate.

46. The method of claim 23 wherein the composition contains from about 0.1–7% by weight tetramethylammonium hydroxide and about 0.01–1% by weight of tetramethylammonium silicate.

47. The method of claim 46 wherein the composition further contains 0.01–1% by weight trans-(1,2-cyclohexylenedinitrilo)tetraacetic acid.

48. A method of extending bath-life of an aqueous alkaline composition for stripping or cleaning integrated circuit substrates wherein said composition comprises:
  (a) one or more metal ion-free bases in an amount sufficient to produce a pH of the composition of about 11 or greater;
  (b) water; and
  (c) from about 0.01 to about 5% by weight of the composition of a water-soluble metal ion-free silicate,
  said method comprising adding to said aqueous alkaline composition a bath stabilizing effective amount of a bath stabilizing agent comprising an acidic compound with at least one pKa in the range of 11 to 13.

49. The method of claim 48 wherein said stabilizing agent comprises an acidic compound with at least one pKa in the range of 11.5 to 12.5.

50. The method of claim 48 wherein said stabilizing agent comprises salicylic acid, sulfosalicylic acid, hydrogen peroxide or phosphoric acid.

51. The method of claim 48 wherein said stabilizing agent is added to a concentration of from 0.1 to 5.0%.

52. The method of claim 48 wherein the bath stabilizing agent is selected from the group consisting of salicylic acid, sulfosalicylic acid, phosphoric acid, hydrogen peroxide, hydrogen germanate, acetone oxime, adenosine, cytosine, arabinose, arginine, ascorbic acid, benzil-α-dioxime, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, cytosine, 2-deoxyglucose, diethylbiguanide, resorcinol, diguanide, hydroquinone, 3,4-dihydroxybenzoic acid, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, formyl-3-methoxypyridine, fructose, galactose, glucose, guanine, guanosine, 2-hydroxybenzaldehyde oxime, N-(hydroxyethyl)biguanide, 2-hydroxypyridine, 2-hydroxyquinoline, hypoxanthene, inosine, 5-iodohistamine, lyxose, mannose, 2,2'-methylenebis(4-chlorophenol), 2-methyl-8-hydroxyquinoline, 4-methyl-8-hydroxyquinoline, 1-methylxanthine, phenylalanylarginine, ribofuranose, silicic acid, sorbose, sparteine, thorin, toluhydroquinone, pyrogallol, tyrosylarginine, xanthosine, xylose, 2-pyridone, acetamidine, trifluoroethanol, trichloroethanol, and pyridine-4-aldehyde.

53. The composition of claim 1 wherein the bath stabilizing agent is selected from the group consisting of salicylic acid, sulfosalicylic acid, phosphoric acid, hydrogen peroxide, hydrogen germanate, acetone oxime, adenosine, cytosine, arabinose, arginine, ascorbic acid, benzil-α-dioxime, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, cytosine, 2-deoxyglucose, diethylbiguanide, resorcinol, diguanide, hydroquinone, 3,4-dihydroxybenzoic acid, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, formyl-3-methoxypyridine, fructose, galactose, glucose, guanine, guanosine, 2-hydroxybenzaldehyde oxime, N-(hydroxyethyl)biguanide, 2-hydroxypyridine, 2-hydroxyquinoline, hypoxanthene, inosine, 5-iodohistamine, lyxose, mannose, 2,2'-methylenebis(4-chlorophenol), 2-methyl-8-hydroxyquinoline, 4-methyl-8-hydroxyquinoline, 1-methylxanthine, phenylalanylarginine, ribofuranose, silicic acid, sorbose, sparteine, thorin, toluhydroquinone, pyrogallol, tyrosylarginine, xanthosine, xylose, 2-pydone, acetamidine, trifluoroethanol, trichloroethanol, and pyridine-4-aldehyde.

54. The method of claim 23 wherein the bath stabilizing agent is selected from the group consisting of salicylic acid, sulfosalicylic acid, phosphoric acid, hydrogen peroxide, hydrogen germanate, acetone oxime, adenosine, cytosine, arabinose, arginine, ascorbic acid, benzil-a-dioxime, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, cytosine, 2-deoxyglucose, diethylbiguanide, resorcinol, diguanide, hydroquinone, 3,4-dihydroxybenzoic acid, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, formyl-3-methoxypyridine, fructose, galactose, glucose, guanine, guanosine, 2-hydroxybenzaldehyde oxime, N-(hydroxyethyl)biguanide, 2-hydroxypyridine, 2-hydroxyquinoline, hypoxanthene, inosine, 5-iodohistamine, lyxose, mannose, 2,2'-methylenebis(4-chlorophenol), 2-methyl-8-hydroxyquinoline, 4-methyl-8-hydroxyquinoline, 1-methylxanthine, phenylalanylarginine, ribofuranose, silicic acid, sorbose, sparteine, thorin, toluhydroquinone, pyrogallol, tyrosylarginine, xanthosine, xylose, 2-pyridone, acetamidine, trifluoroethanol, trichloroethanol, and pyridine-4-aldehyde.

* * * * *